Dec. 23, 1969 B. ROCKOWER 3,485,211

MOUNT FOR ENCAPSULATION OF ELECTRONIC COMPONENTS

Filed Aug. 15, 1968 3 Sheets-Sheet 1

INVENTOR:
BERTRAM ROCKOWER
BY Arthur A. Smith, Jr.
ATTORNEY

MOUNT FOR ENCAPSULATION OF ELECTRONIC COMPONENTS

Filed Aug. 15, 1968 3 Sheets-Sheet 2

INVENTOR
BERTRAM ROCKOWER
BY Arthur A. Smith, Jr.
ATTORNEY

INVENTOR:
BERTRAM ROCKOWER
BY Arthur A. Smith, Jr.
ATTORNEY

United States Patent Office 3,485,211
Patented Dec. 23, 1969

3,485,211

MOUNT FOR ENCAPSULATION OF ELECTRONIC COMPONENTS

Bertram Rockower, Marblehead, Mass., assignor to Massachusetts Institute of Technology, Cambridge, Mass., a corporation of Massachusetts Filed Aug. 15, 1968, Ser. No. 752,878
Int. Cl. B05c 11/14
U.S. Cl. 118—503 9 Claims

ABSTRACT OF THE DISCLOSURE

Rotatable apparatus for mounting cylindrical or toroidal-like electronic components having steep skirted surfaces so as to enable homogeneous encapsulation of those surfaces by the standard vapor deposition process. The mount comprises a suspension ring defining a bore and coupled to a pair of mutually opposing cone-shaped walls. The ring's bore is proportioned to secure firmly the electronic component, and covering plates are provided such that only those component surfaces to be encapsulated are exposed. Heat and vapor from low lying sources are deflected onto the exposed surfaces by means of the cone-like walls, and the covering plates. Exhaust apertures are positioned within the mount in close proximity to the exposed surfaces so as to draw the vapor by the surfaces. Where, as is usual, the component is a gyro motor stator or other component having windings on both ends, the mount is rotated at a constant rate.

The invention herein described was made in the course of work performed under a contract with the Department of the Navy.

BACKGROUND OF THE INVENTION

Field of the invention

This invention relates generally to vapor deposition of electronic components and particularly to apparatus for mounting substantially cylindrical or toroidal shaped electronic components having steep skirted surfaces such as to enable homogeneous encapsulation of those surfaces by the vapor deposition process.

Description of the prior art

Electronic components are frequently encapsulated to provide a smooth and rigid protective film. Molded epoxy resin is sometimes used as an encapsulant, but glass is preferred because of its comparative advantages. Unlike epoxy resin, glass is chemically stable and forms a more rigid encapsulant.

The glass is applied by a vapor deposition process. Typically, the component is suspended in a heated vacuum chamber above a container of arsenic trisulfide glass. The quantity of glass used depends on depth sought of the film and the surface area to be covered. The glass is first totally vaporised and then a chemically inert gas, such as nitrogen, is injected into the chamber. The nitrogen prevents the glass from revaporizing when the chamber is subsequently heated to vitrify the glass.

While the aforementioned process works well for flat or nearly flat surfaces, problems arise when the surface of the component has steep sides such as in the case with cylindrical-like or toroidal-like shapes. In the latter instances, the glass does not settle homogeneously on the entire surface. Areas which are exposed to the same degree to the vapor flow are homogeneously coated. But those areas which are not so exposed receive correspondingly less or no coating.

The aforementioned limitations are demonstrated in the glass encapsulation of the stator windings of a gyro drive motor, such as stator assembly 2 depicted in FIG. 1. As noted therein, stator assembly 2 is substantially toroidal, comprising metal laminated inner rim 4 defining stator bore 3, the inner rim being enclosed by metal laminated outer rim 6. (As shown, the rims bound a toroidal-like ring of finite thickness.) Rims 4 and 6 are intercoupled via stator winding coils 8 mounted on the two end surfaces of the rims. Stator winding coils 8 form a dome-like configuration, of vertical height F, the top of which has a flattened crown **8*a* with reference to which the sides or skirts 8*b* are at relatively steep oblique angles. Winding coils 8 are so mounted as to leave exposed a portion of the end surfaces of rims 4 and 6 such that the juncture of winding coils 8 with the end surfaces of rims 4 and 6 to form two inner flange-like edges 10 and two outer flange-like edges 12. The object of the vapor deposition process is to coat all areas of winding coils 8** with a homogeneous layer of glass.

As previously mentioned, stator assembly 2 is suspended in an evacuated chamber above a container of arsenic trisulfide glass. Upon being heated, the glass forms a rising vapor. Crown **8*a* of stator 2 receives adequate coating since it is prominently exposed to the rising glass vapor. However, portions of sides 8*b* are decreasingly exposed to the vapor in direct proportion to their obliqueness, the extreme being those areas parallel to the flow which merge into edges 10 and 12**. The result is a non-homogeneous and hence generally unsatisfactory coating of the stator assembly.

SUMMARY OF THE INVENTION

In view of the aforementioned limitations in the encapsulation of electronic components having steep skirted surfaces, applicant's prime object is to provide a mount to allow homogeneous coating of such surfaces by the standard vapor deposition process.

It is a further object of the invention to provide a mount to hold a substantially cylindrically or toroidally configured component, having steep skirted surfaces, in such a way as to allow homogeneous coating of such surfaces by standard vapor deposition techniques.

It is a still further object of the invention to provide a mount for holding a gyro motor stator so as to enable homogeneous glass encapsulation of the stator windings while preventing deposition on the remaining portions of the stator.

These and other objects are met by a mount comprising a suspension ring bounded by and coupled to a pair of truncated hollow cones. The suspension ring is proportioned to nestle the component placed therein, and the vertical height of the mount's suspension ring is substantially identical to the vertical height of that portion of the component's outer surface on which vapor deposition is not desired (i.e., for a stator, this is usually the outer rim). Center plates cover the component's bore or portion of its inner surface which is not to be encapsulated. The result is that only those areas of the component which are to be encapsulated (such as the winding coils of a stator) remain exposed. Exhaust holes are disposed on the mount about its vertical axis and positioned in proximity with the steep skirts or sides of the areas to be coated.

The inverted cones and center plates deflect heat and vapor onto the exposed areas of the component so as to create homogeneous coating. The exhaust holes draw vapor by the steep skirted or less exposed portions so as to further ensure even encapsulation.

These and other objects of the invention will be apparent from the specification which follows in conjunction with the accompanying drawings of which:

PREFERRED EMBODIMENT

Figure 1:
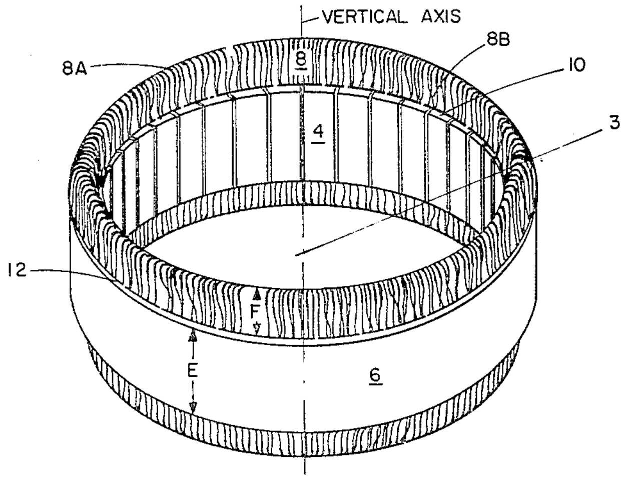
FIG. 1 is an angle view showing the top and side of a typical stator assembly, the windings of which are to be encapsulated.

Although subject invention is generally applicable as a means of enabling vapor deposition on any steep skirted surface of substantially cylindical or toroidal configuration, for ease of illustration, the preferred embodiment of subject invention is described in terms of a mount specifically proportioned for gyro motor stators of the type previously shown in FIG. 1.

Figure 2:
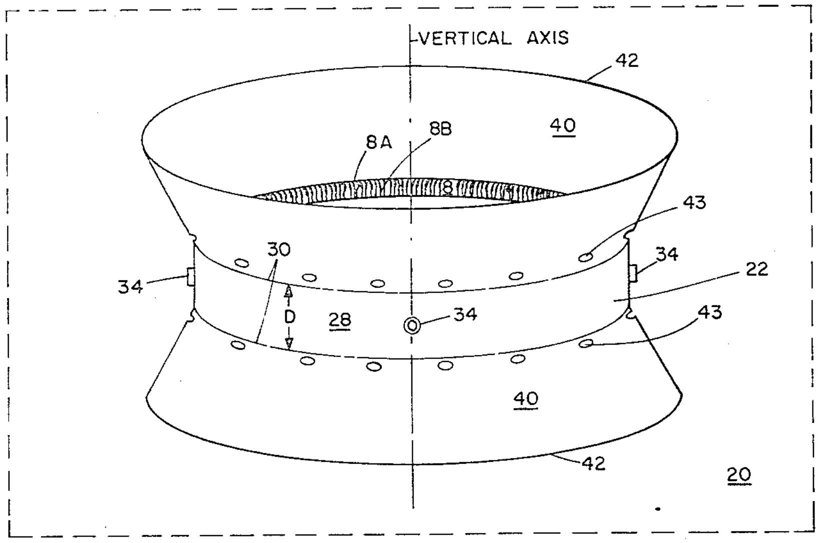
FIG. 2 is an external side view of the mount showing a portion of the stator of FIG. 1 suspended therein.
Figure 3A:
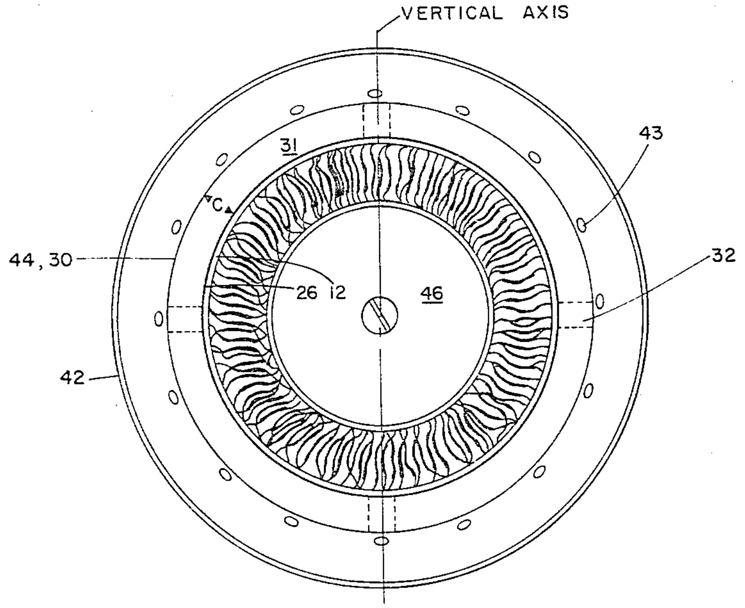
FIG. 3A is a top view of the assembled mount and associated stator of FIG. 2.
Figure 3:
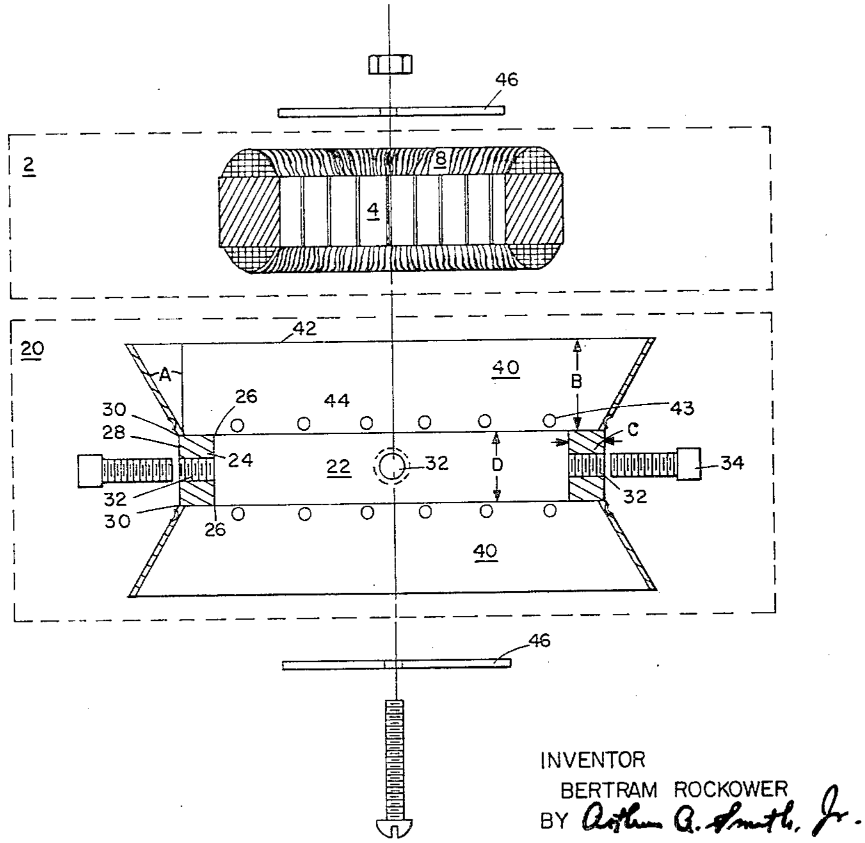
FIG. 3 is an exploded cross-sectional side view of the stator of FIG. 1 and of the mount as it is proportioned to receive the stator of FIG. 1.

FIG. 2 taken in conjunction with FIG. 3 illustrates mount 20 as proportioned for gyro motor stator 2. As noted in the figures, mount 20 comprises suspension ring 22 coupled to mutually opposing truncated hollow cones 40. Suspension ring 22, of wall thickness C and vertical height D, comprises inner rim 24 bounded by inner edges 26 and defining bore 27 outer rim 28 bounded by peripheral edges 30, and two mutually opposing end surfaces 31. Four taps 32 thread through ring 22 at 90 degree intervals perpendicular to the vertical axis so as to disect ring 22.

Each of cones 40 comprises base 42 and apex 44, and has a vertical height B and slant angle A. Apex 44 of one of cones 40 is mounted to ring 22 on one of end surfaces 31, while apex 44 of the other of cones 40 is mounted to ring 22 on the other of end surfaces 31. (The cones are usually mounted at peripheral edges 30.) In the preferred embodiment, a total of 16 exhaust apertures 43 are spaced equally about the vertical axis immediately above the junction of each of cones 40 and ring 22.

Vertical height D of ring 22 is substantially identical to vertical height E of stator rim 6, and ring bore 27 is proportioned to allow stator 2 to nestle axially therein such that there is effectively no space between stator rim 6 and ring rim 24. Set screws 34 rigidly secure stator 2 within the suspension ring via taps 32. Stator rim 4 is protected from encapsulation by center plates 46, one each of which rests on one each of flange-like edges 10 of stator 2. The plates are secured by hardware extending through sized holes on the vertical axis. The result is that only winding coils 8 of the stator are exposed. A top view of stator 2 suspended within mount 22 is shown in FIG. 3A.

The surfaces of ring 22, center plates 46, and cones 40 are smooth and reflective.

Figures 4, 4A:
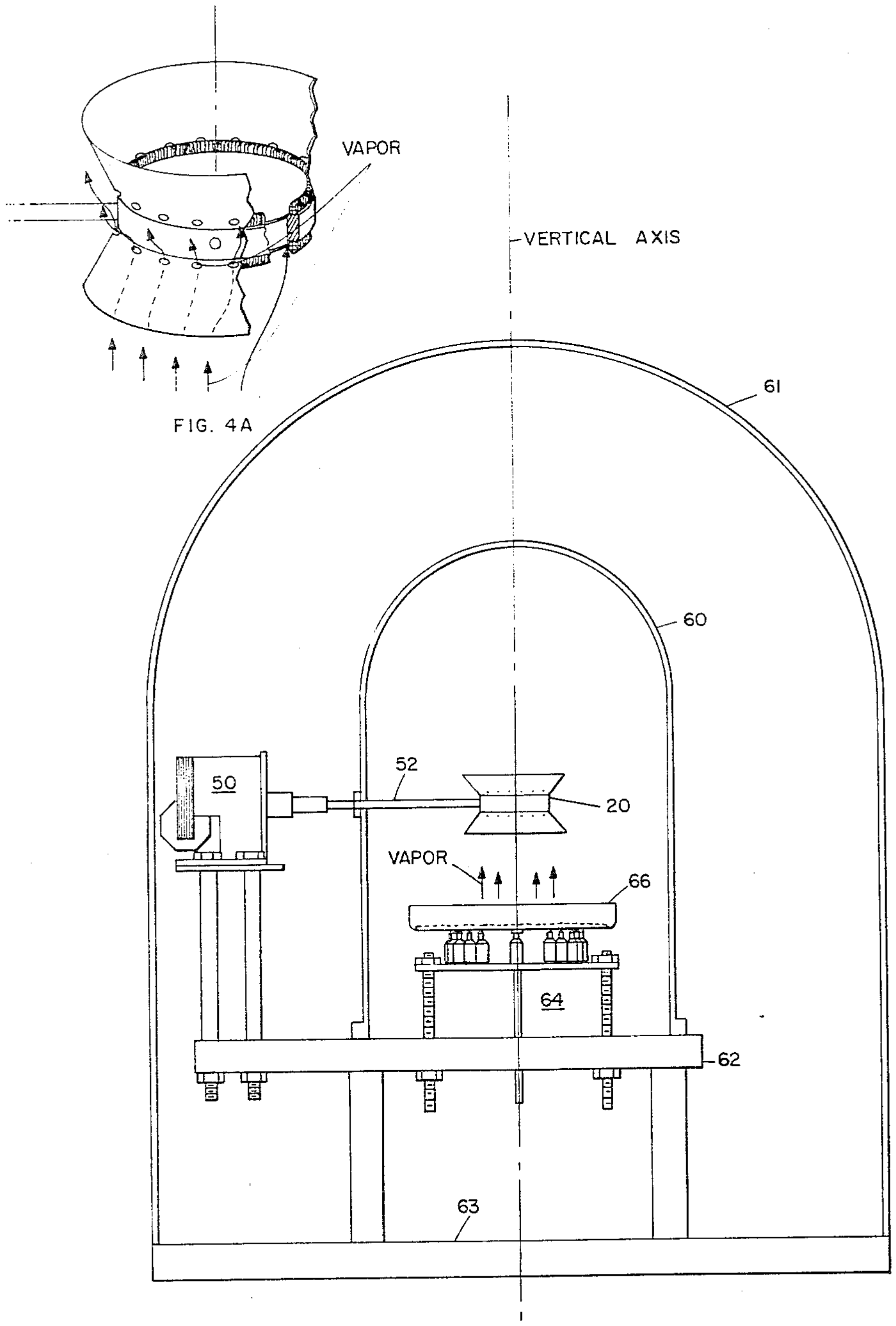
FIG. 4 is a side view of the mount in conjunction with other apparatus used in the standard vapor deposition process.
FIG. 4A is an exploded view of the mount suspending the stator, showing vapor flow through the exhaust apertures.

Mount 20 is shown in FIG. 4 in conjunction with the standard apparatus used in the typical vapor deposition process. As noted, mount 20 (holding stator 2) is coupled to unidirectional motor 50 via one of set screws 34 which has been elongated to serve as a motor shaft, hereinafter referred to as shaft 52. Shaft 52 extends through an aperture in heat resistant bell jar 60. In the preferred embodiment, for efficiency of operation, the length of shaft 52 is such that the mount and stator secured therein is centered within bell jar 60 and its vertical axis substantially coincides with the vertical axis of the jar. Motor 50 and bell jar 60 are mounted on base 62. Heater assembly 64 is also mounted on base 62 and is centered within bell jar 60 such that its vertical axis substantially coincides with the vertical axis of both the jar and mount-stator unit. Heat-resistant dish 66, having an area at least equivalent to the area of the heating surface, is mounted on heater assembly 64. The material to be vaporized, for example, arsenic trisulfide glass, is arranged within dish 66 such that when vaporized a substantial portion of the fumes impinges on stator 2. The quantity of glass used depends on the surface area to be encapsulated and the depth of coating desired. Base 62, supporting the aforementioned apparatus, is itself mounted on base 63 which has a smooth surface capable of holding a vacuum when properly sealed. Bell jar 61 is mounted on base 63 and encloses the entire assembly.

Referring now to FIG. 4 and to FIG. 4A, the encapsulation process is generally as follows. A vacuum is created within bell jar 61 and motor 50 is then activated so as to continuously rotate mount 20 and hence stator 2 at a uniform rate, preferably relatively slowly to allow even coverage. (For example, in the preferred embodiment for the particular stator used, rotation is at approximately 3.5 r.p.m.) As the glass is vaporized by heater assembly 64, the vapors rise and many of them feed into cone 40 and are drawn through exhaust apertures 43. Because of the close proximity of exhaust apertures 43 to outer skirt 8b of stator 2, a significant portion of the glass vapors coat the skirt as they are drawn by it. Even spacing of exhaust apertures 43 homogeneous coating. Other of the fumes impinge directly on crown 8a of the winding coil, while inner skirt 8b of the winding coil is coated by fumes reflecting from center plate 46. In addition, because of the aforementioned smoothness of ring 22 and cones 40, other of the fumes are reflected from these surfaces onto inner and outer skirts 8b and crown 8a. The result is a substantially homogeneous coating of winding coils 8. It is understood that this process is identical for both ends of stator 2 due to the uniform rotation of mount 20 during the process.

After vaporization has been completed, the heat is increased for a short period of time in order to revaporize whatever of the arsenic trisulfide glass has settled onto the surfaces of mount 20 or onto stator 2. An inert nitrogen atmosphere is then introduced and temperature is further increased. The inert atmosphere prevents the coating on stator 2 from completely revaporizing and rising to the top of bell jar 60. The increased heat vitrifies the encapsulant and completes the process. Stator 2 is then released from the mount and the center plates are removed.

Although it has been found that for maximum efficiency of operation, each mount should be proportioned for the particular component configuration and size being encapsulated, experimentation has also shown that the following design parameters apply to any particular mount where optimum efficiency is desired; the slant angle A at the junction of each of the cones and the mount's suspension ring should preferably be 25 degrees ±5 degrees; the vertical height B of the cone walls should be at least three times the vertical height F of the exposed surface to be encapsulated (e.g., the windings in a stator); the circumference of the inner surface or rim of the ring which circumscribes the ring's bore should be dimensioned such that the component to be encapsulated nestles within the bore, and the vertical height D of the suspension ring's inner surface or rim should be identical to the vertical height of that portion of the component's outer surface which is not to be coated (e.g., the outer rim of the stator).

Further, in the preferred embodiment, the exhaust apertures are shown disposed along the walls of the cones in close proximity to the juncture of the cones and the suspension ring. The apertures may also be located on the suspension ring itself for purposes of the invention and are not limited to any particular number or size. The only crucial limitation is that the exhaust apertures must be located near to the steep skirted surfaces to be encapsulated so as to ensure vapor flow by those surfaces.

For the stator of FIG. 1, having an outer diameter of approximately 1.580 inches, bore 3 diameter of approximately 1.310 inches, outer rim vertical height E of about 0.24 inch, and a vertical height of windings coil 8 of approximately 0.138 inch, the dimensions of the preferred embodiment of the mount are approximately as follows:

| | | |
|---|---|---|
| Suspension Ring: | | |
| Vertical height D | inches | 0.240 |
| Diameter | do | 1.870 |
| Wall thickness C | do | 0.135 |
| Bore diameter | do | 1.60 |
| Cone: | | |
| Vertical height B | do | 0.431 |
| Slant angle A | deg. | 25 ±5 |
| Base | inches | 2.287 |
| Apex | do | 1.870 |
| Cone wall thickness | do | 0.014 |
| Exhaust Apertures (32 total, 16/side): | | |
| Diameter | inches | 0.0467–0.0472 |
| Degrees apart | deg. | 22–23 |
| Center Plates: | | |
| Diameter | inches | 1.315 |
| Thickness | do | 0.031 |

Although subject invention is most clearly demonstrated in the encapsulation of gyro motor stators, it has application to any other substantially cylindrically or toroidally configured components having steep skirted surfaces. Where only one surface is to be encapsulated (versus mutually opposing surfaces), only one truncated hollow cone is needed. Where it is desired to encapsulate the entire inner surface of a component, the center plates are not used. Further, although in the preferred embodiment, the mount is rotated at a uniform rate, rotation is not essential. Consequently, it is understood that subject invention is not limited to the particular mount dimensions described for the preferred embodiment.

Having thus described my invention, I claim:

1. A mount, having a vertical axis, for suspending a substantially toroidally configured electronic component so as to enable homogeneous encapsulation of said component by a vapor deposition process, wherein said electronic component includes at least a first inner rim defining a first bore, a first outer rim of vertical height E circumscribing said first inner rim, and mutually opposing domelike ends having a vertical height F, each of said ends comprising a crown and internal and external steep skirted sides, said mount comprising in combination:

- a suspension ring having a second inner rim of vertical height D defining a second bore and a second outer rim circumscribing said second inner rim, said second rims bounding a wall of thickness C having two mutually opposing end surfaces, said second bore being adapted to nestle said electronic component;
- means for covering said first bore to prevent said vapor deposition on said first inner rim;
- a pair of truncated hollow cones each having a base, an apex, a slant angle A, and a vertical height B, said apex of each of said cones being mounted to one of said opposing end surfaces; and
- wherein said mount has a plurality of exhaust apertures adapted to permit the flow of said vapor by said component's external steep skirted sides.

2. A mount as set forth in claim 1 wherein said exhaust apertures are in each of said cones and spaced by substantially equal angular increments about said vertical axis of said mount.

3. A mount as set forth in claim 1 wherein said exhaust apertures are in both end surfaces of said ring, are spaced by substantially equal angular increments about said vertical axis of said mount and lie within the end surface portions bounded by the joinder with said cones.

4. A mount as defined in claim 1 wherein said vertical height E is substantially identical to said vertical height D and said vertical height B is at least three times greater than said vertical height F.

5. A mount as defined in claim 1 wherein the surfaces of said suspension ring, said cones, and said covering means are smooth and reflective for optimum utilization of said vapor.

6. A mount, having a vertical axis, for suspending a gyro motor stator of the type including a toroidal-like first ring of vertical height E bounded by a first inner rim defining a first bore, a first outer rim circumscribing said first inner rim, and two mutually opposing ends, said stator further including two domelike winding coils of vertical height F, one each of said coils coupled to one each of said ring's ends, each of said coils comprising a crown and internal and external deep skirted oblique sides, wherein said mount is adapted to enable homogeneous encapsulation of said coils by a vapor deposition process, said mount comprising in combination:

- a toroidal-like second ring of vertical height D, said height D being substantially equal to said height E, said second ring being bounded by a second inner rim defining a second bore, a second outer rim circumscribing said second inner rim, and two mutually opposing end surfaces, said second ring being adapted to nestle said first ring within said second bore such that said winding coils protrude above said two end surfaces of said second ring;
- means for securing said stator within said second ring;
- a pair of center plates, one each of said plates coupled to one each of said first ring's ends so as to cover said first bore;
- a pair of truncated hollow cones each having a base, an apex, a slant angle A, and a vertical height B, said apex of each of said cones being mounted to one of said end surfaces of said second ring; and
- a plurality of exhaust apertures adapted to permit flow of said vapor by said external steep skirted sides of said winding coils.

7. The mount as specified in claim 6 wherein said exhaust apertures are located in each of said cones and spaced by substantially equal angular increments about said vertical axis of said mount.

8. The mount as specified in claim 6 wherein the surfaces of said second ring, said cones, and said center plates are smooth and reflective.

9. The mount as specified in claim 6 wherein said slant angle A is 25°±5°, and said vertical height B is at least three times said vertical height F.

References Cited

UNITED STATES PATENTS

| | | | |
|---|---|---|---|
| 2,081,666 | 5/1937 | Gunn | 118—505 |
| 2,821,130 | 1/1958 | Hummel | 118—505 X |
| 3,034,479 | 5/1962 | Larsh et al. | 118—406 |
| 3,136,650 | 6/1964 | Avila. | |
| 3,192,896 | 7/1965 | Irving | 118—505 |
| 3,261,707 | 7/1966 | Korski. | |
| 3,315,638 | 4/1967 | Hajduk et al. | 118—505 |
| 3,440,078 | 4/1969 | Sharetts | 118—406 X |

MORRIS KAPLAN, Primary Examiner